United States Patent
Yamazaki et al.

(10) Patent No.: US 9,188,323 B2
(45) Date of Patent: Nov. 17, 2015

(54) LIGHTING DEVICE

(75) Inventors: Shunpei Yamazaki, Tokyo (JP); Takuya Kawata, Kanagawa (JP); Kohei Yokoyama, Kanagawa (JP); Hisao Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 53 days.

(21) Appl. No.: 13/253,159

(22) Filed: Oct. 5, 2011

(65) Prior Publication Data

US 2012/0099331 A1 Apr. 26, 2012

(30) Foreign Application Priority Data

Oct. 20, 2010 (JP) ................. 2010-235112

(51) Int. Cl.
| | | |
|---|---|---|
| *B60Q 3/04* | (2006.01) | |
| *F21V 31/00* | (2006.01) | |
| *H01L 51/52* | (2006.01) | |
| *F21K 99/00* | (2010.01) | |
| *F21S 2/00* | (2006.01) | |
| *F21S 8/04* | (2006.01) | |
| *F21Y 105/00* | (2006.01) | |
| *F21S 6/00* | (2006.01) | |
| *F21S 8/00* | (2006.01) | |

(52) U.S. Cl.
CPC ............ *F21V 31/00* (2013.01); *H01L 51/5203* (2013.01); *H01L 51/524* (2013.01); *H01L 51/5243* (2013.01); *H01L 51/5246* (2013.01); *F21K 9/10* (2013.01); *F21S 2/00* (2013.01); *F21S 6/002* (2013.01); *F21S 8/033* (2013.01); *F21S 8/04* (2013.01); *F21Y 2105/008* (2013.01); *H01L 51/5212* (2013.01); *H01L 51/5275* (2013.01); *H01L 2251/5361* (2013.01)

(58) Field of Classification Search
CPC .................. H01L 51/5243; H01L 51/5246
USPC .................. 313/498–512; 362/362
See application file for complete search history.

(56) References Cited

U.S. PATENT DOCUMENTS

| | | | |
|---|---|---|---|
| 6,080,031 A * | 6/2000 | Rogers et al. ................. 445/25 |
| 6,933,537 B2 * | 8/2005 | Yee et al. ................. 257/99 |
| 7,692,199 B2 | 4/2010 | Arai | |

(Continued)

FOREIGN PATENT DOCUMENTS

| | | |
|---|---|---|
| JP | 02-066870 A | 3/1990 |
| JP | 2000-048952 A | 2/2000 |

(Continued)

*Primary Examiner* — Karabi Guharay
*Assistant Examiner* — Zachary J Snyder
(74) *Attorney, Agent, or Firm* — Nixon Peabody LLP; Jeffrey L. Costellia

(57) ABSTRACT

To improve reliability of a lighting device using an electroluminescent material. In a lighting device which includes a light-emitting element containing an electroluminescence (EL) layer, a first housing is provided on a light emission surface of the light-emitting element, a metal plate and a second housing covering the metal plate are provided over a top surface of the light-emitting element, and the first housing is connected to both the metal plate and the second housing, whereby the light-emitting element is doubly sealed. Further, a depressed portion is provided for the first housing in a region in contact with the metal plate or a region in contact with the second housing through an adhesive layer; thus, adhesion between the housings is improved.

16 Claims, 12 Drawing Sheets

(56) References Cited

U.S. PATENT DOCUMENTS

| | | | |
|---|---|---|---|
| 2002/0070663 A1* | 6/2002 | Ogura et al. | 313/506 |
| 2004/0043249 A1* | 3/2004 | Su et al. | 428/690 |
| 2005/0116636 A1* | 6/2005 | Kang | 313/512 |
| 2005/0258436 A1 | 11/2005 | Arai | |
| 2005/0285522 A1 | 12/2005 | Han et al. | |
| 2006/0087224 A1* | 4/2006 | Oki et al. | 313/504 |
| 2007/0170860 A1* | 7/2007 | Choi et al. | 313/512 |
| 2007/0172971 A1* | 7/2007 | Boroson | 438/26 |
| 2008/0117519 A1* | 5/2008 | Chari et al. | 359/619 |
| 2009/0039780 A1* | 2/2009 | Kim et al. | 313/512 |
| 2009/0066242 A1* | 3/2009 | Koo | 313/506 |
| 2009/0078933 A1* | 3/2009 | Koo et al. | 257/40 |
| 2009/0161022 A1* | 6/2009 | Suzuki et al. | 348/725 |
| 2010/0006882 A1 | 1/2010 | Arai | |
| 2011/0057210 A1* | 3/2011 | Sonoda et al. | 257/88 |
| 2011/0121352 A1* | 5/2011 | Hesse et al. | 257/99 |
| 2011/0273077 A1* | 11/2011 | Chen et al. | 313/483 |
| 2011/0289809 A1* | 12/2011 | Lee et al. | 40/718 |

FOREIGN PATENT DOCUMENTS

| | | |
|---|---|---|
| JP | 2001-068271 A | 3/2001 |
| JP | 2004-152699 A | 5/2004 |
| JP | 2005-332773 | 12/2005 |
| JP | 2006-054146 A | 2/2006 |
| JP | 2006-294490 A | 10/2006 |
| JP | 2008-089634 A | 4/2008 |
| JP | 2008-235503 A | 10/2008 |
| JP | 2010-055894 A | 3/2010 |
| JP | 2010-146895 A | 7/2010 |
| WO | WO-2007/032515 | 3/2007 |

\* cited by examiner

FIG. 10A1
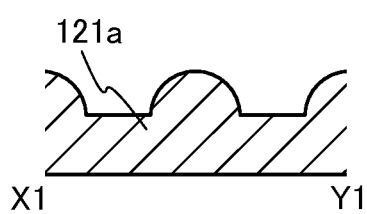
FIG. 10A2
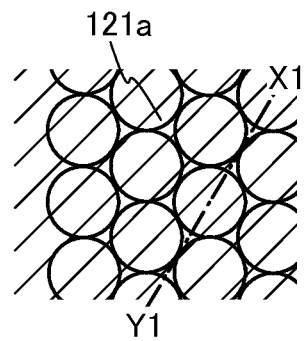
FIG. 10B1
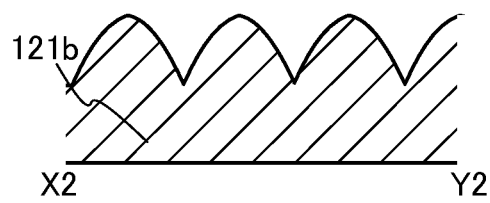
FIG. 10B2
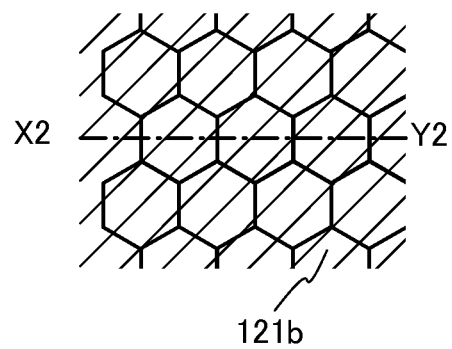

LIGHTING DEVICE

BACKGROUND OF THE INVENTION

1. Field of the Invention

One embodiment of the present invention relates to a lighting device including a light-emitting member which exhibits electroluminescence.

2. Description of the Related Art

As a next-generation lighting device, a lighting device using an electroluminescent material has attracted attention because it is estimated to have higher emission efficiency than filament bulbs or fluorescent bulbs. A thin film of an electroluminescent material can be formed to a thickness of 1 μm or less by an evaporation method or a coating method. Further, the structure of such a lighting device has been devised; for example, some inventions disclose a lighting device using an electroluminescent material in which the luminance is kept constant even when the area of the lighting device is increased (for example, see Patent Document 1).

REFERENCE

Patent Document

[Patent Document 1] Japanese Published Patent Application No. 2005-332773

SUMMARY OF THE INVENTION

According to one embodiment of the present invention, an object is to improve reliability of a lighting device using an electroluminescent material.

In the lighting device which includes a light-emitting element containing an electroluminescence (EL) layer, a first housing is provided on a light emission surface of the light-emitting element, a metal plate and a second housing covering the metal plate are provided over a top surface of the light-emitting element, and the first housing is connected to both the metal plate and the second housing, whereby the light-emitting element is doubly sealed.

One embodiment of the present invention is a lighting device which includes a light-emitting element including an EL layer sandwiched between a first electrode and a second electrode, a first housing and a metal plate which seal the light-emitting element using a first adhesive layer, and a second housing which seals the light-emitting element and the metal plate with the first housing using a second adhesive layer. In the lighting device, the first housing covers a light emission surface of the light-emitting element and includes a first depressed portion in a region in contact with the first adhesive layer and a second depressed portion in a region in contact with the second adhesive layer, and at least one of the first electrode and the second electrode is provided for the light emission surface of the light-emitting element and has a light-transmitting property. Note that in this specification, a light-transmitting property refers to a property of transmitting light at least in the visible wavelength range.

Another embodiment of the present invention is a lighting device which includes a light-emitting element including an EL layer sandwiched between a first electrode and a second electrode, a first housing and a metal plate which seal the light-emitting element using a first adhesive layer, and a second housing which seals the light-emitting element and the metal plate with the first housing using a second adhesive layer. In the lighting device, the first housing covers a light emission surface of the light-emitting element and includes a first depressed portion in a region in contact with the first adhesive layer and a second depressed portion in a region in contact with the second adhesive layer, at least one of the first electrode and the second electrode is provided for the light emission surface of the light-emitting element and has a light-transmitting property, an auxiliary wiring is provided between the first housing and the first electrode, the auxiliary wiring is arranged in a third depressed portion and a fourth depressed portion which are provided in the first housing, and the thicknesses and widths of the auxiliary wirings arranged in the third depressed portion and the fourth depressed portion are different from each other.

An inorganic insulating film may be provided between the first housing and the first electrode, or the first housing and the auxiliary wiring. The inorganic insulating film functions as a protective layer or a sealing film, which protects the light-emitting element from an external contaminant such as water. The inorganic insulating film can be formed to have either a single layer or a stacked layer of a nitride film and a nitride oxide film. By providing the inorganic insulating film, deterioration of the light-emitting element is suppressed and the durability and the lifetime of the lighting device can be improved.

Further, the EL layer may have two or more layers with an intermediate layer interposed therebetween. By stacking a plurality of EL layers with different emission colors, an emission color to be provided can be controlled. By stacking a plurality of EL layers even with the same color, an effect of improving power efficiency can be obtained.

In the lighting device of one embodiment of the present invention, adhesion between housings which are bonded to surround the light-emitting element is increased; thus, defective shape due to physical impact is hard to occur. Therefore, damages of the lighting device in the manufacture or use of the device can be reduced. Further, since the lighting device of this embodiment has a structure in which element deterioration is not easily caused, a lighting device having long lifetime can be provided. Accordingly, reliability of a lighting device that is one embodiment of the present invention can be improved.

BRIEF DESCRIPTION OF THE DRAWINGS

FIGS. 10A1, 10A2, 10B1, and 10B2 are cross-sectional views and plan views illustrating a lighting device.

DETAILED DESCRIPTION OF THE INVENTION

Figure 1A:
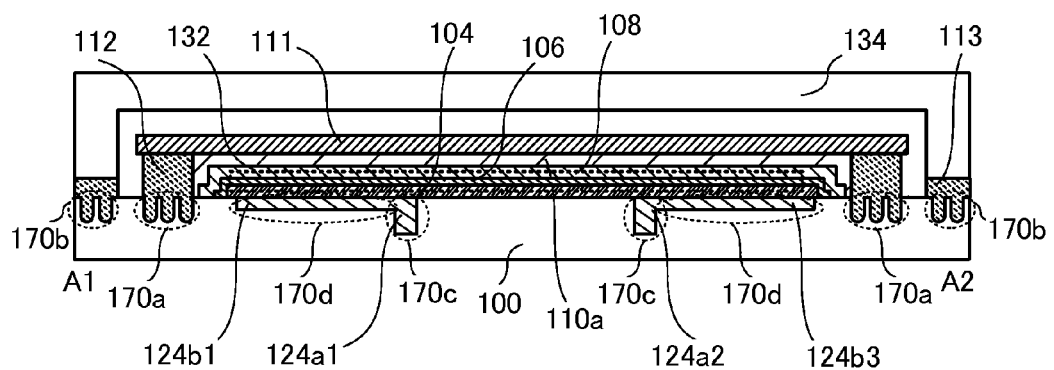
FIGS. 1A and 1B are cross-sectional views illustrating a lighting device.

Embodiments will be described in detail with reference to the drawings However, the present invention is not limited to the following description and various changes for the modes and details thereof will be apparent to those skilled in the art unless such changes depart from the spirit and the scope of the invention. The present invention should not be construed as being limited to the following description. In the structures to be given below, the same portions or portions having similar functions are denoted by the same reference numerals in different drawings, and explanation thereof will not be repeated. Further, in some cases, the same hatching patterns are applied to similar parts, and the similar parts are not necessarily designated by reference numerals.

Embodiment 1

In Embodiment 1, one embodiment of a lighting device of the present invention will be described with reference to FIGS. 1A and 1B, FIG. 2, FIGS. 3A and 3B, FIG. 4, FIGS. 5A and 5B, FIG. 6, and FIGS. 10A1, 10A2, 10B1, and 10B2.

Figure 1B:
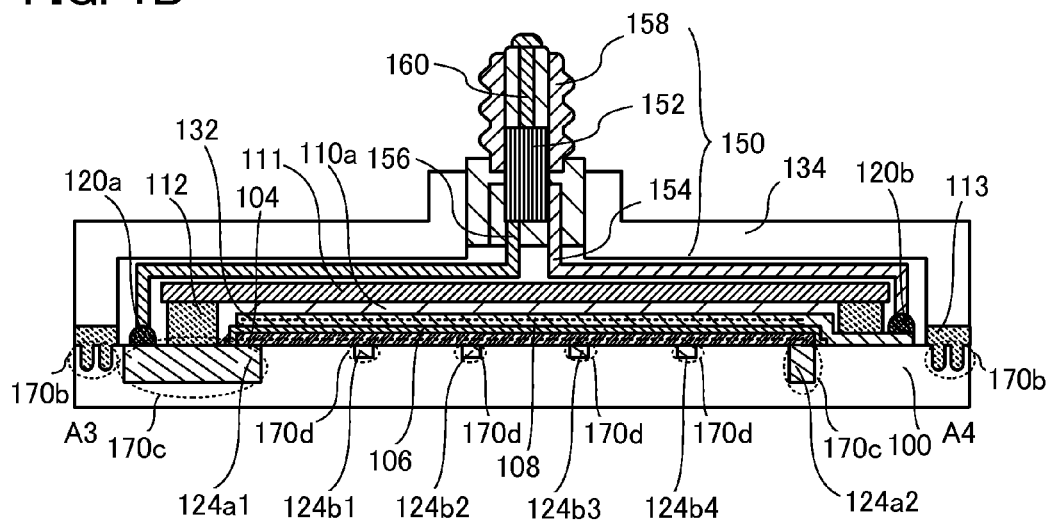
Figure 2:
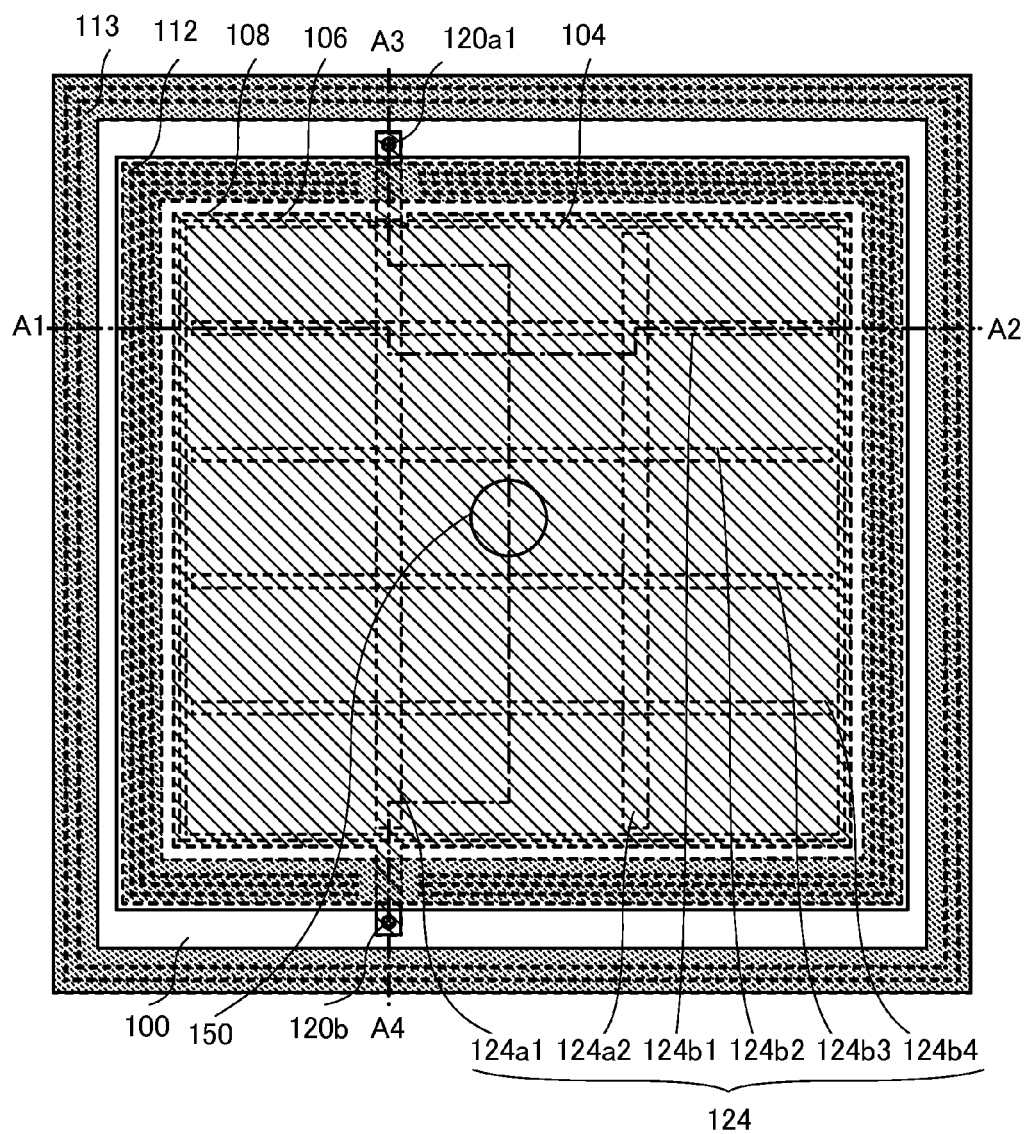
FIG. 2 is a plan view illustrating a lighting device.

FIGS. 1A and 1B are cross-sectional views illustrating a lighting device of this embodiment. FIG. 2 is a plan view illustrating a lighting device. FIG. 1A is a cross-sectional view taken along line A1-A2 of FIG. 2, and FIG. 1B is a cross-sectional view taken along line A3-A4 of FIG. 2.

In the light emitting device illustrated in FIGS. 1A and 1B, and FIG. 2, a first housing 100 is provided on a light emission surface of a light-emitting element 132 including an EL layer 106, and a metal plate 111 and a second housing 134 covering the metal plate 111 are provided over a top surface of the light-emitting element 132. Further, the first housing 100 is connected to both the metal plate 111 and the second housing 134, whereby the light-emitting element 132 is doubly sealed.

The light-emitting element 132 includes a first electrode 104, an EL layer 106, and a second electrode 108. Light from the EL layer 106 passes through the first electrode 104 and the first housing 100, and is emitted to the outside. Thus, a surface on the first electrode 104 side is a light emission surface. Accordingly, the first electrode 104 and the first housing 100 have a light-transmitting property so that light from the EL layer 106 is transmitted.

Note that in this specification, a light-emitting element refers to an element using an electroluminescence (EL) effect in a principle of light emission. Specifically, for the light-emitting element 132, a light emitting diode (LED), an organic EL element, an inorganic EL element, or the like can be used. For example, in the case where an LED is used as the light-emitting element 132, aluminum gallium arsenide (AlGaAs), gallium arsenide phosphide (GaAsP), indium gallium nitride (InGaN), gallium nitride (GaN), aluminum gallium nitride (AlGaN), gallium phosphide (GaP), zinc selenide (ZnSe), aluminum gallium indium phosphide (AlGaInP), or the like can be used for a material of the EL layer 106.

The shape of the emission surface of the light-emitting element 132 can be a circular shape in addition to a polygonal shape such as a quadrangle, and the housing (the first housing 100) covering the emission surface may be formed to correspond to the shape of the emission surface.

Further, a plurality of light-emitting elements 132 may be provided between a pair of the first housing 100 and the second housing 134. In the case where the plurality of light-emitting elements 132 is provided, the light-emitting elements 132 may be connected to connection terminal portions with an external power source of the lighting device individually, or may be electrically connected in series or in parallel to a common connection terminal portion. For example, a plurality of light-emitting elements having different emission colors is provided and connected to the connection terminal portions with an external power source of the lighting device individually to control a current value and a voltage value, so that light emission color from the light-emitting device can be adjusted and color rendering properties thereof can be improved.

The metal plate 111 opposite to the first housing 100 is provided over the top surface of the light-emitting element 132. There is no particular limitation on the thickness of the metal plate 111; however, the metal plate with a thickness of greater than or equal to 10 μm and less than or equal to 200 μm is preferably used because reduction in weight of the lighting device can be achieved. A material of the metal plate 111 is not limited to a particular material, but it is preferable to use a metal such as aluminum, copper, or nickel, an alloy such as an aluminum alloy or stainless steel, or the like.

The metal plate 111 and the first housing 100 are bonded to each other using a first adhesive layer 112 so as to seal the light-emitting element 132. As the first adhesive layer 112, a visible light curable adhesive, an ultraviolet curable adhesive, or a thermosetting adhesive can be used. As examples of materials of such adhesives, an epoxy resin, an acrylic resin, a silicone resin, a phenol resin, and the like can be given. In addition, a moisture-absorbing substance serving as a drying agent may be contained in such adhesives.

In FIGS. 1A and 1B, the first adhesive layer 112 is provided so as to surround the periphery of the light-emitting element 132; however, the present embodiment is not limited to this. For example, a first adhesive layer for covering the periphery and the top surface of the light-emitting element 132 may be formed and the light-emitting element may be sealed using the first adhesive layer 112.

Because the metal plate 111 has low water permeability, sealing of the light-emitting element 132 with the metal plate 111 and the first housing 100 can prevent moisture from entering the light-emitting element 132. Thus, by providing the metal plate 111, a highly reliable lighting device in which deterioration due to moisture is suppressed can be obtained.

The first housing 100 includes a first depressed portion 170a in a region in contact with the first adhesive layer 112. The first depressed portion 170a can be formed by etching or the like. By providing the first depressed portion 170a in the first housing 100, part of the first adhesive layer 112 is arranged in the first depressed portion 170a and functions as a wedge (that is, part of the first adhesive layer 112 has a so-called anchoring effect). Thus, adhesion between the first housing 100 and the metal plate 111 can be improved.

One or more first depressed portions 170a can be provided. Note that in FIGS. 1A and 1B, and FIG. 2, the first depressed portions 170a are provided so as to surround the periphery of the light-emitting element 132 except a terminal portion; however, a structure of one embodiment of the present invention is not limited to this.

Further, the second housing 134 opposite to the first housing 100 is provided over the top surface of the metal plate 111. The first housing 100 and the second housing 134 are bonded to each other using a second adhesive layer 113 to seal the light-emitting element 132 and the metal plate 111.

As a specific example of a member used for the first housing 100 or the second housing 134, plastic (organic resin), glass, quartz, or the like can be given. As an example of plastic, a member made from polycarbonate, polyarylate, polyethersulfone, or the like can be given. It is preferable to use plastic for the first housing 100 or the second housing 134, because reduction in weight of the lighting device can be achieved.

The first housing 100 includes a second depressed portion 170b in a region in contact with the second adhesive layer 113. The second depressed portion 170b can be formed by etching or the like. By providing the second depressed portion 170b in the first housing 100, part of the second adhesive layer 113 is arranged in the second depressed portion 170b and functions as a wedge (that is, part of the second adhesive layer 113 has a so-called anchoring effect). Thus, adhesion between the first housing 100 and the second housing 134 can be improved. Note that the second housing 134 may have a depressed portion in a region in contact with the second adhesive layer 113.

One or more second depressed portions 170b can be provided. Note that in FIGS. 1A and 1B, and FIG. 2, the second depressed portions 170b are provided so as to surround the periphery of the metal plate 111; however, a structure of one embodiment of the present invention is not limited to this.

As a material of the second adhesive layer 113, the same material as that of the first adhesive layer 112 can be used. It is preferable to use the same organic resin material for the second adhesive layer 113, the first housing 100, and the second housing 134 because adhesion between the first housing 100 and the second housing 134 can be improved, and resistivity to breaking is increased. Further, the second adhesive layer 113 is not necessarily provided, for example, a thermoplastic organic resin is used as the first housing 100 and the second housing 134, and the first housing 100 and the second housing 134 are bonded to each other by thermocompression bonding.

The size of the first housing 100 and the second housing 134 can be set as appropriate depending on application of the lighting device. For example, the lighting device may have a discoid shape with a diameter of 10 cm to 14 cm, preferably 12 cm, or may have a 5-inch-square shape.

Further, an auxiliary wiring 124 may be formed between the first housing 100 and the first electrode 104. In this embodiment, the auxiliary wiring 124 includes regions 124a1 and 124a2 arranged in third depressed portions 170c in the first housing 100, and regions 124b1, 124b2, 124b3, and 124b4 arranged in fourth depressed portions 170d in the first housing 100.

Note that the first depressed portions 170a to the fourth depressed portions 170d in the first housing 100 can be formed in the same etching process.

The auxiliary wiring 124 is formed to fill the third depressed portions 170c and the fourth depressed portions 170d in the first housing 100. The auxiliary wiring 124 can be formed with a single layer or a stacked layer using a conductive material such as aluminum (Al), titanium (Ti), tantalum (Ta), tungsten (W), molybdenum (Mo), chromium (Cr), neodymium (Nd), scandium (Sc), nickel (Ni), or copper (Cu) or an alloy material including any of these materials as its main component. Alternatively, the auxiliary wiring 124 may be formed using a conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added. The auxiliary wiring 124 can be formed by forming a conductive film by a sputtering method, an evaporation method, a coating method, or the like and selectively removing the conductive film.

Alternatively, the auxiliary wiring 124 may be selectively formed by an ink jet method, a printing method, or the like. For example, in the case of forming the auxiliary wiring 124 by a printing method, the auxiliary wiring 124 can be formed by selectively printing conductive paste where conductive particles having a grain diameter of several nanometers to several tens micrometers are dissolved or dispersed in an organic resin. As the conductive particle, at least one of metal particles of silver (Ag), gold (Au), copper (Cu), nickel (Ni), platinum (Pt), palladium (Pd), tantalum (Ta), molybdenum (Mo), titanium (Ti), and the like or fine particles of silver halide can be used. In addition, as the organic resin included in the conductive paste, one or more selected from organic resins functioning as a binder of metal particles, a solvent, a dispersing agent and a coating material can be used. Organic resins such as an epoxy resin or a silicone resin can be given as representative examples. Further, in forming the conductive layer, it is preferable to bake the conductive paste after being provided. Alternatively, fine particles containing solder or lead-free solder as its main component may be used. Note that the conductive paste can be used for conductive layers 120a and 120b which electrically connect the light-emitting element 132 and a connecting member 10.

The thickness and width of the auxiliary wiring 124 in the regions 124a1 and 124a2 arranged in the third depressed portions 170c in the first housing 100 are different from the thickness and width of the auxiliary wiring 124 in the regions 124b1, 124b2, 124b3, and 124b4 arranged in the fourth depressed portions 170d in the first housing 100. Specifically, the third depressed portion has a deeper and wider groove than the fourth depressed portion 170d; thus, a wiring with a larger thickness and a wider width is formed in the regions 124a1 and 124a2 than the wiring in the regions, 124b1, 124b2, 124b3, and 124b4. Further, in FIGS. 1A and 1B, and FIG. 2, part of the region 124a1 of the auxiliary wiring 124 is electrically connected to a first connection wiring 16 through a conductive layer 120a and functions as a terminal.

The auxiliary wiring 124 is arranged in the depressed portions in the first housing 170, so that the thickness of auxiliary wiring 124 can be thick. Thus, the width of the auxiliary wiring 124 is made narrower while the resistance of the auxiliary wiring 124 is kept low. Regions of the auxiliary wiring 124 with different thicknesses and widths are selectively formed, and the thickness and the width of a region functioning as at least a terminal are made large and wide, whereby low power consumption can be achieved. Further, a region which has smaller thickness and narrower width is provided in the auxiliary wiring 124, whereby a decrease in an irradiation area can be suppressed. Further, by providing a reflective auxiliary wiring 124, light emitted from the light-emitting element 132 can be scattered. Thus, an effect of improving the efficiency of light extraction can be obtained.

Figure 11A:
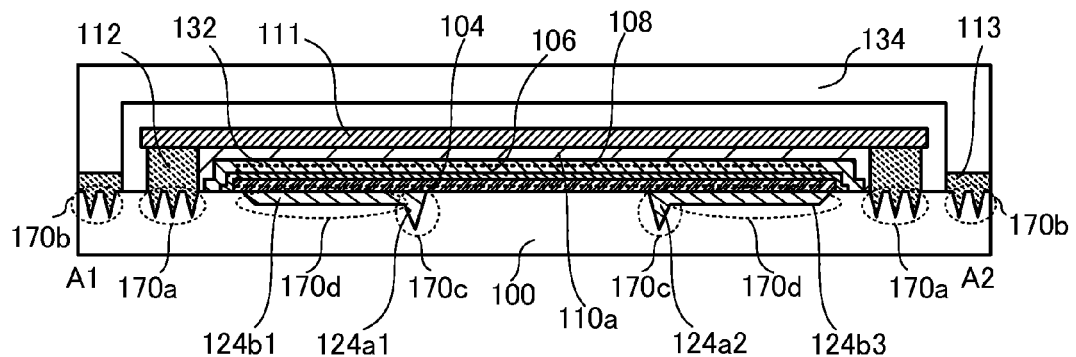
FIGS. 11A and 11B are cross-sectional views illustrating a lighting device.
Figure 11B:
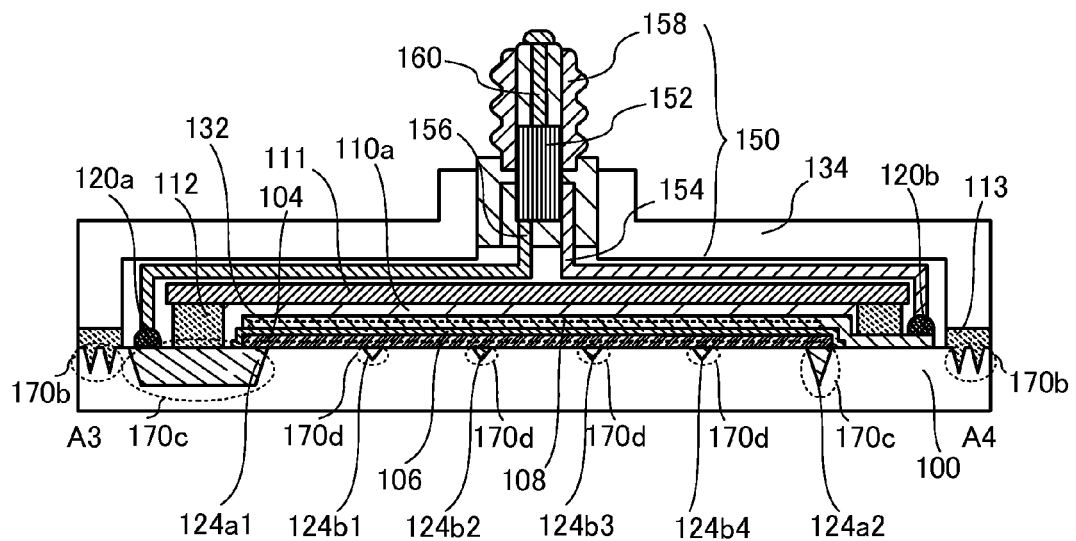

Note that the shapes of the first depressed portion 170a to the fourth depressed portion 170d are not limited to those illustrated in FIGS. 1A and 1B. For example, the side faces of the first depressed portion 170a to the fourth depressed portion 170d may be tapered as illustrated in FIGS. 11A and 11B. Alternatively, the side faces of the first depressed portion 170a to the fourth depressed portion 170d may be inversely tapered.

Further, an optical film may be provided on a light emission surface side of the lighting device. For example, a diffusion film may be provided on a light emission surface of the first housing 100.

Further, it is preferable to provide an inorganic insulating film for covering an inner wall of the housing in which the light-emitting element 132 is provided or a top surface of the light-emitting element 132. FIGS. 1A and 1B, and FIG. 2 illustrate an example of forming an inorganic insulating film 110a for covering the top surface of the light-emitting element 132. The inorganic insulating film 110a functions as a protective layer or a sealing film, which protects the light-emitting element from an external contaminant such as water. By providing the inorganic insulating film, deterioration of the light-emitting element is suppressed and the durability and the lifetime of the lighting device can be improved.

The inorganic insulating film 110a can be formed to have either a single layer or a stacked layer of a nitride film and a nitride oxide film. Specifically, the inorganic insulating film 110a can be formed using silicon oxide, silicon nitride, silicon oxynitride, aluminum oxide, aluminum nitride, aluminum oxynitride, or the like by a CVD method, a sputtering method, or the like. Preferably, the inorganic insulating film 110a may be formed using silicon nitride by a CVD method. The thickness of the inorganic insulating film 110a is set to about 100 nm to 1 µm.

Alternatively, the inorganic insulating film 110a may be formed using an aluminum oxide film, a diamond like carbon (DLC) film, a carbon film containing nitride, or a film containing zinc sulfide and silicon oxide (a $ZnS·SiO_2$ film).

Further, the lighting device illustrated in FIGS. 1A and 1B, and FIG. 2 is provided with the connecting member 10 (also referred to as a base) connected to an external power source.

The connecting member 10 is arranged in an opening provided in the second housing 134 above the light-emitting element 132. The connecting member 10 includes a control circuit 12, the first connection wiring 16, a second connection wiring 14, a first extraction wiring 160, and a second extraction wiring 18. The connecting member 10 may have a diameter of 10 mm to 40 mm, typically a diameter of about 2 mm.

The connecting member 10 is arranged so as to be fit in the opening of the second housing 134. The connecting member 150 may be provided so as to be screwed into the second housing 134, and equipment for fixing a portion where the second housing 134 is in contact with the connecting member 150 may be provided so as to enhance fixing strength.

The first electrode 104 of the light-emitting element 132 is electrically connected to the first extraction wiring 160 through the auxiliary wiring 124, the conductive layer 120a, the first connection wiring 156, and the control circuit 152. The second electrode 108 of the light-emitting element 132 is electrically connected to the second extraction wiring 158 through the conductive layer 120b, the second connection wiring 154, and the control circuit 152. The connecting member 150 is connected to the external power source, whereby the lighting device can be supplied with power from the external power source and be turned on.

The control circuit 152 has a function of making the light-emitting element 132 emit light with a constant luminance on the basis of a power source voltage supplied from an external power source. For example, alternating-current voltage of 100V (110V) supplied from external power source is converted into direct-current voltage (DC) of 5V to 10V by a converter of the control circuit 152.

The control circuit 152 includes, for example, a rectifying and smoothing circuit, a constant voltage circuit, and a constant current circuit. A rectifying and smoothing circuit is a circuit for converting alternating-current voltage supplied from an external alternating power source into direct-current voltage. The rectifying and smoothing circuit may be formed by a combination of a diode bridge circuit, a smoothing capacitor, and the like, for example. A constant voltage circuit is a circuit for outputting a signal of stabilized constant voltage which is converted from direct voltage including a ripple output from the rectifying and smoothing circuit. The constant voltage circuit may be formed using a switching regulator, a series regulator, or the like. The constant current circuit is a circuit for outputting a constant current to the light-emitting element 132 in accordance with the voltage of the constant voltage circuit. The constant current circuit may be formed using a transistor or the like. Here, the case where a commercial alternating-current power source is used as an external power source is assumed, and an example in which the rectifying and smoothing circuit is provided is described; however, in the case where a direct-current power source is used as the external power source, the rectifying and smoothing circuit is not necessarily provided. The control circuit 152 may be provided with a circuit for controlling luminance, a protective circuit for protection against surge, or the like as needed.

FIGS. 1A and 1B illustrate an example in which bump connection using the conductive layers 120a and 120b is used for connecting portions of the connecting member 10 and the light-emitting element 132; however, any of other methods or structures can be employed as long as the connecting member 150 is electrically connected to the light-emitting element 132. For example, an anisotropic conductive film may be used in the connecting portions of the connecting member 150 and the light-emitting element 132, or a conductive film used in the connecting portions may be formed with a material capable of being connected by a solder and connection is performed with the use of a solder. The conductive layers 120a and 120b are connected and fixed to the first connection wiring 16 and the second connection wiring 14, respectively, using an anisotropic conductive film or a solder. In addition, a resin for fixing may be provided around the connecting portions. Further, the metal plate 111 and an electrode of the light-emitting element 132 may be electrically connected so that the metal plate 111 is electrically connected to the connecting member 150. For example, it is possible to electrically connect the second electrode 108 to the metal plate 111 using conductive paste or the like, and connect and fix the metal plate 111 to the second connection wiring 154 using an anisotropic conductive film or a solder.

Further, the connecting member 150 can be formed in various shapes as long as it is provided with a connection wiring capable of being electrically connected to the light-emitting element 132 and an extraction wiring capable of supplying power from an external power source.

A moisture-absorbing substance serving as a drying agent may be provided in a space between the first housing 100 in which the light-emitting element 132 is provided and the second housing 134. The moisture-absorbing substance may be set in a solid state such as a powdery state or a film state containing a moisture-absorbing substance over the metal plate 111, the inorganic insulating film 110a, or the light-emitting element 132 by a deposition method such as a sputtering method. Alternatively, the space between the first housing 100 and the second housing 134 may be sealed with a resin such as an epoxy resin, an acrylic resin, a silicone resin, and a phenol resin.

Figure 3A:
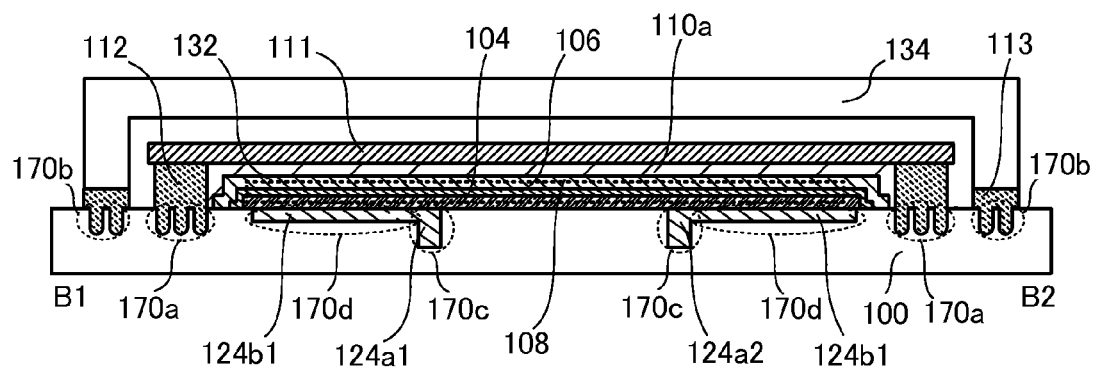
FIGS. 3A and 3B are cross-sectional views illustrating a lighting device.
Figure 3B:
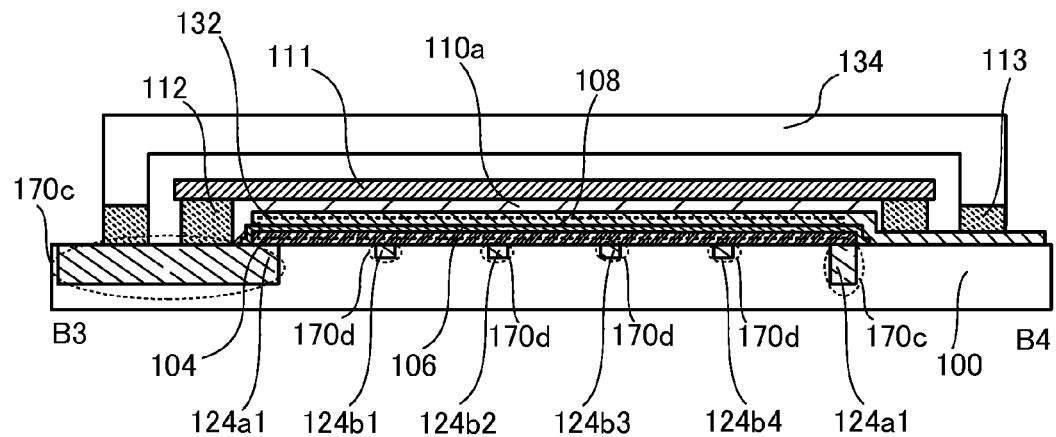
Figure 4:
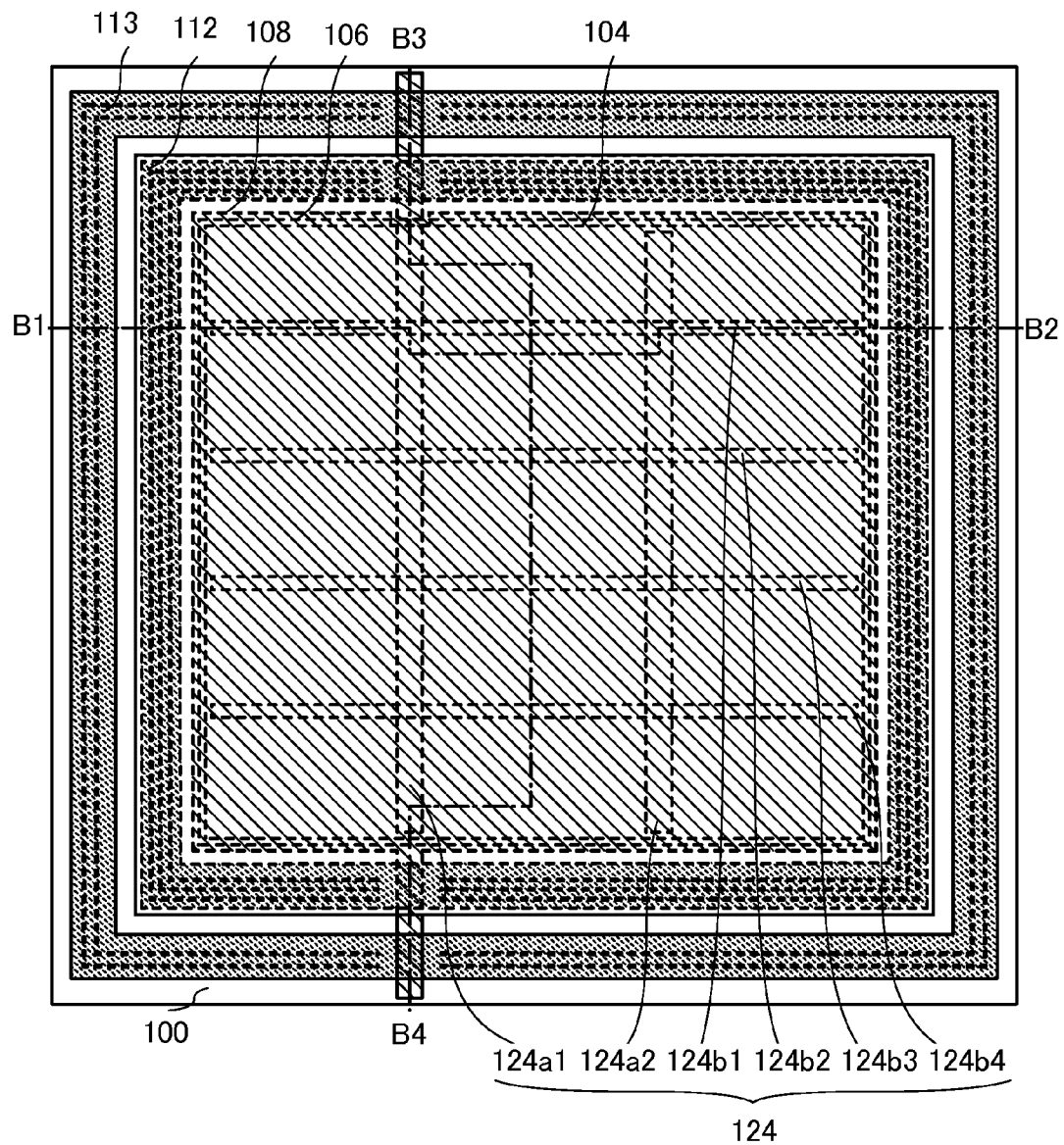
FIG. 4 is a plan view illustrating a lighting device.

Note that the connecting member 150 which is connected to the external power source is not necessarily provided. FIGS. 3A and 3B and FIG. 4 illustrate an example of a lighting device without the connecting member 150. FIG. 4 is a plan view of a lighting device illustrated in FIGS. 3A and 3B. FIG. 3A is a cross-sectional view taken along line B1-B2 of FIG. 4, and FIG. 3B is a cross-sectional view taken along line B3-B4 of FIG. 4.

In the lighting device illustrated in FIGS. 3A and 3B and FIG. 4, the auxiliary wiring 124 which is electrically connected to the first electrode 104 and the second electrode 108 are connected to an external power source. As illustrated in FIG. 3B, part of the auxiliary wiring 124 (part of the region 124a1) which is electrically connected to the first electrode 104 and part of the second electrode 108 are extended and exposed from the second housing 134. The region exposed from the second housing 134 functions as a connection terminal with the external power source. Note that when part of the auxiliary wiring 124 and part of the second electrode 108 are exposed from the second housing 134, the first depressed portion 170a and the second depressed portion 170b are provided so as to surround the periphery of the light-emitting element 132 except a terminal portion as illustrated in FIG. 4.

Note that there are a variety of structures to be employed for the lighting device which is provided with the connecting portion for connection to the external power source; therefore, the structure is not limited to those shown in this embodiment.

Figure 5A:
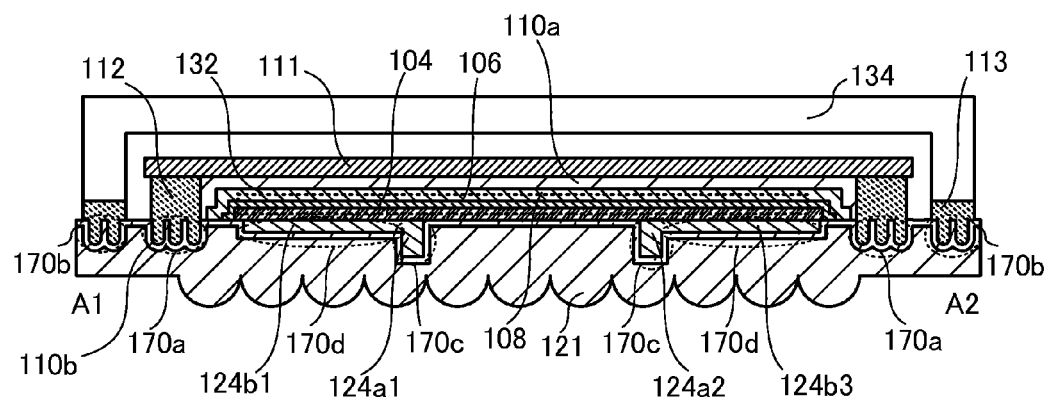
FIGS. 5A and 5B are cross-sectional views illustrating a lighting device.
Figure 5B:
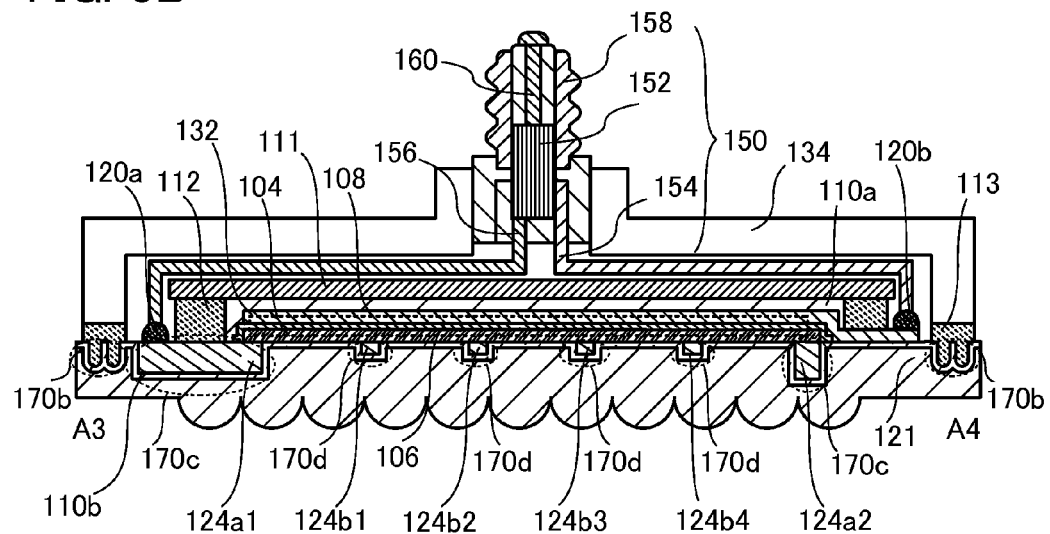

Further, FIGS. 5A and 5B illustrate another example of cross-sectional views of the lighting device illustrated in FIG. 2. FIGS. 5A and 5B each illustrate an example of the lighting device having an uneven shape including a plurality of projections and depressions such as a microlens array is provided on the light emission surface side (on the side opposite to the light-emitting element 132) in a first housing 121. The lighting device having an uneven shape including a plurality of projections and depressions, total reflection at the interface between the first housing 121 and the air can be suppressed; thus, the efficiency of light extraction to the outside of the housing can be improved.

The first housing 121 having an uneven shape can be formed using an organic resin as a material. The shape of the organic resin can be processed by heat treatment or light irradiation treatment depending on characteristics of the organic resin. For example, the first housing 121 having an uneven shape can be formed in the following manner: a support having an uneven shape which serves as a mold of the uneven shape is prepared; a thermoplastic organic resin is used as a material of the housing; the thermoplastic organic resin is pressed to the support while heat treatment is performed, so that the thermoplastic organic resin is changed in shape so as to reflect the shape of the support; and then cooling is performed to perform curing.

Note that in a step of forming an uneven shape including a plurality of projections and depressions for the first housing 121, a support having an uneven shape corresponding to the first depressed portion 170a to the fourth depressed portion 170d may be used as the support on the light-emitting element 132 side of the first housing 121. Thus, the uneven shape including a plurality of projections and depressions provided on the light emission surface side of the first housing 121, and the first depressed portion 170a to the fourth depressed portion 170d provided on the As a specific example of a member used for the first housing 121, an organic resin (plastic) can be given. As an example of plastic, a member made from polycarbonate, polyarylate, polyethersulfone, or the like can be given.

The lighting device illustrated in FIGS. 5A and 5B includes an inorganic insulating film 110b on the first depressed portion 170a to the fourth depressed portion 170d. The inorganic insulating film 110b can be formed of the same material as the inorganic insulating film 110a through the same manufacturing steps. The thickness of the inorganic insulating film 110a may be determined as appropriate depending on the thickness of the first housing 121a, the depths of the first depressed portion 170a to the fourth depressed portion 170d, and the like, for example, about 100 nm to 1 μm. The inorganic insulating film 110b functions as a protective layer or a sealing film, which protects the light-emitting element from an external contaminant such as water. By providing the inorganic insulating film, deterioration of the light-emitting element is suppressed and the durability and the lifetime of the lighting device can be improved.

FIGS. 10A1, 10A2, 10B1, and 10B2 illustrate examples of cross-sectional views and plan views of the first housing 121 in FIGS. 5A and 5B. FIGS. 10A2 and 10B2 are examples of plan views of the first housing 121a and the first housing 121B which have uneven shapes. FIG. 10A1 is a cross-sectional view taken along line X1-Y1 of FIG. 10A2 and FIG. 10B1 is a cross-sectional view taken along line X2-Y2 of FIG. 10B2.

The first housing 121a in FIGS. 10A1 and 10A2 has an uneven shape in which the base of a projection has a circular form. Further, the first housing 121a in FIGS. 10B1 and 10B2 has an uneven shape in which the base of a projection has a regular hexagon. The pitch or the bottom shape of the projection included in the first housing 121 can be set variously, and it is not limited to the structure of FIGS. 10A1, 10A2, 10B1, and 10B2. The first housing 121a may have an uneven shape with an apex such as a circular cone and a pyramid (e.g., a triangular pyramid or a square pyramid). Note that as illustrated in FIGS. 10B1 and 10B2, it is preferable to form an uneven shape to have a so-called honeycomb structure in which the base of the projection has a regular hexagon because filling density in the uneven shape can be improved and the efficiency of light extraction to the outside of the housing can be further improved.

Figure 12:
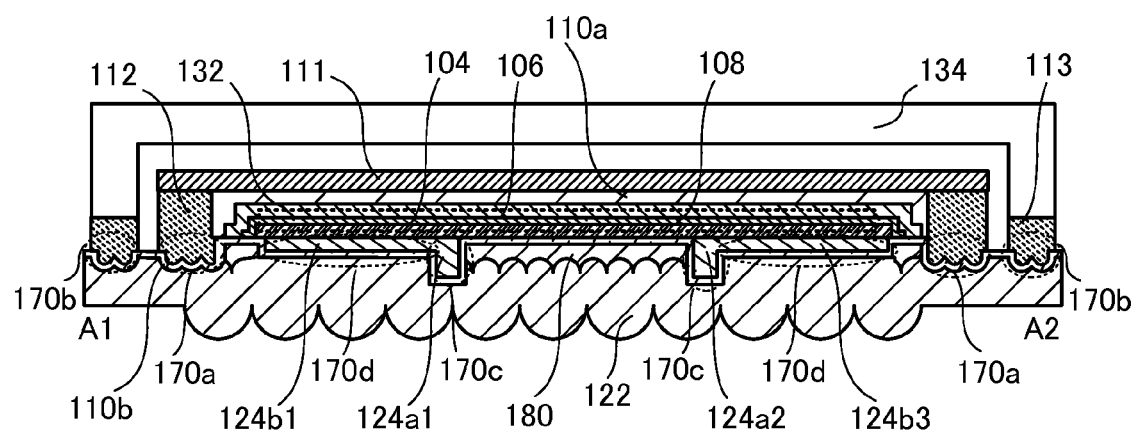
FIG. 12 is a cross-sectional view illustrating a lighting device.

Further, as illustrated in FIG. 12, a first housing 122 having an uneven shape including a plurality of projections and depressions such as a microlens array may be used both on the light emission surface side (on the side opposite to the light-emitting element 132) and the light-emitting element 132 side.

The first housing 122 illustrated in FIG. 12 has an uneven shape including a plurality of projections and depressions on the light emission surface side, and has the first depressed portion 170a to the fourth depressed portion 170d and a plurality of projections and depressions on the light-emitting element 132 side. Further, in FIG. 12, the plurality of projections and depressions provided on the light-emitting element 132 side is formed in a region overlapping with the light-emitting element 132, where the first depressed portion 170a to the fourth depressed portion 170d are not formed. Further, a high refractive index material layer 180 is provided in the region having the projections and depressions on the light-emitting element 132 side of the first housing 122 so as to be in contact with the projections and depressions. Note that although the uneven shape provided for the first housing 122 in a striped form are effective, an uneven shape in a matrix is preferable.

The first housing 122 illustrated in FIG. 12 has an uneven shape including a plurality of projections and depressions on the light emission surface side thereof; thus, total reflection at the interface between the first housing 122 and the air can be suppressed. Further, the plurality of projection and depression are included between the first housing 122 and the high refractive index material layer 180; thus, total reflection at the interface between the high refractive index material layer 180 and the first housing 122 can be suppressed, and the efficiency of light extraction to the outside of the housing can be further improved.

As examples of the material that can be used for the first housing 122, glass, a resin, and the like whose refractive index is greater than 1.0 and less than 1.6 are given. As the resin, a polyester resin, a polyacrylonitrile resin, a polyimide resin, a polymethyl methacrylate resin, a polycarbonate resin, a polyethersulfone resin, a polyamide resin, a cycloolefin resin, a polystyrene resin, a polyamide imide resin, a polyvinylchloride resin, or the like can be used. In particular, a material whose refractive index is greater than or equal to 1.4 and less than 1.6 is preferably used.

As a method for forming an uneven shape in the above material, for example, an etching method, a sand blasting method, a microblast processing method, a droplet discharge method, a printing method (screen printing or offset printing by which a pattern is formed), a coating method such as a spin coating method, a dipping method, a dispenser method, an imprint method, a nanoimprint method, or the like can be employed as appropriate. Further, as described above, the first housing 122 may be formed with the uneven shape including a plurality of projections and depressions on the light emission surface side of the first housing 122 and the uneven shape including a plurality of projections and depressions and supports corresponding to the first depressed portion 170a to the fourth depressed portion 170d, respectively, on the light-emitting element side of the first housing.

Further, the high refractive index material layer 180 can be formed using a resin with a high refractive index. The high refractive index material layer 180 has a light-transmitting property and the refractive index of the high refractive index material layer 180 is greater than or equal to 1.6, preferably greater than or equal to 1.7 and less than or equal to 2.1. As examples of a resin with a high refractive index, a resin containing bromine, a resin containing sulfur, and the like are given. For example, a sulfur-containing polyimide resin, an episulfide resin, a thiourethane resin, a brominated aromatic resin, or the like can be used. In addition, polyethylene terephthalate (PET), triacetyl cellulose (TAC), or the like can be used. Any of a variety of methods suitable for the material may be employed for forming the high refractive index material layer 180 in consideration of the adhesion strength, ease of processing, or the like. For example, any of the above resins is selectively deposited so as to be in contact with the uneven shape including a plurality of projections and depressions provided on the light-emitting element 132 side of the first housing 122 by a spin coating method and is cured by heat or light, so that the high refractive index material layer 180 can be formed. Note that the high refractive index material layer 180 also functions as a planarization film for the uneven shape including a plurality of projections and depressions provided on the light-emitting element 132 side of the first housing 122.

In general, a resin with a high refractive index is expensive. In the lighting device illustrated in FIG. 12, the high refractive index material layer 180 may be selectively formed to be in contact with the uneven shape including a plurality of projections and depressions in the region which overlaps with the light-emitting element 132. The high refractive index material layer 180 is formed to be as thin as several tens of micrometers. Thus, the lighting device with high light extraction efficiency can be manufactured at low cost.

The pitch or the bottom shape of the projection formed on both surfaces of the first housing 122 can be set variously. For example, other than the shape illustrated in FIGS. 10A1, 10A2, 10B1, and 10B2, the first housing 122 may have an uneven shape with an apex such as a circular cone and a pyramid (e.g., a triangular pyramid or a square pyramid). However, as illustrated in FIGS. 10B1 and 10B2, it is preferable to form the uneven shape to have a so-called honeycomb structure in which the base of the projection has a regular hexagon because filling density in the uneven shape can be improved and the efficiency of light extraction to the outside of the housing can be further improved. Note that the uneven shapes formed on both surfaces of the first housing 122 may be the same or different from each other.

Further, the size or height of the projection included in the uneven shape on the side being in contact with the high refractive index material layer 180 is preferably about 0.1 μm to 100 μm. The size or height of the projection included in the uneven shape on the opposite side is preferably about 0.1 μm to 1000 μm. The size of the projection included in the uneven shape on the side being in contact with the high refractive index material layer 180 affects the amount of material used for the high refractive index material layer 180, which narrows the allowable range of the size or height of the projection. In contrast, the projection included in the uneven shape on the opposite side may have a size or height exceeding 1000 μm. In particular, the projection included in the uneven shape on both sides preferably has a size or height of greater than or equal to 1 μm, in which case influence of interference of light can be reduced.

In FIG. 12, an inorganic insulating film 110b is provided between the light-emitting element 132 and the first housing 122. It is preferable to use a nitride film with a refractive index of greater than or equal to 1.6 as the inorganic insulating film 110b because diffusion of impurities into the light-emitting element can be prevented without decreasing the efficiency of light extraction.

Figure 6:
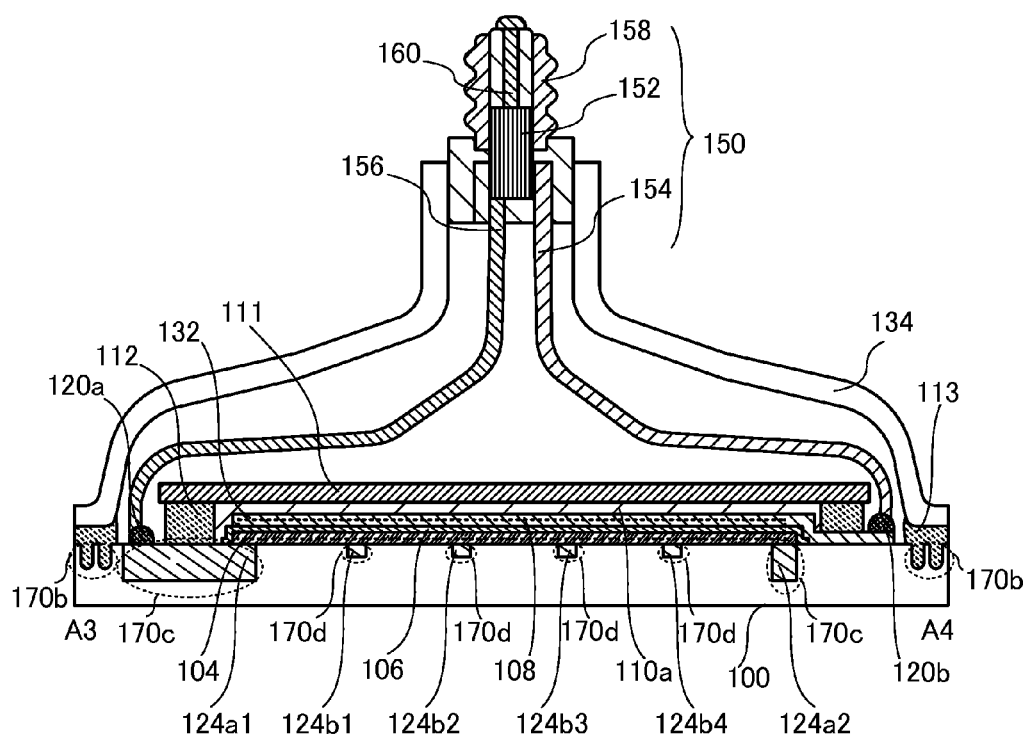
FIG. 6 is a cross-sectional view illustrating a lighting device.

Further, the shape of the lighting device is not limited to those illustrated in FIGS. 1A and 1B, FIG. 2, FIGS. 3A and 3B, FIG. 4, FIGS. 5A and 5B, FIGS. 11A and 11B, and FIG. 12. For example, FIG. 6 illustrates another example of a cross-sectional view of the lighting device in FIG. 2. FIG. 6 is an example in which a housing with a curved surface is used as the second housing 134. The light-emitting element of the lighting device of this embodiment is formed in a thin film, which increases the degree of freedom in design. Accordingly, various elaborately-designed products can be obtained.

Note that the structure of the lighting device shown in this embodiment can be combined as appropriate.

In the lighting device of one embodiment of the present invention, adhesion between housings which are bonded to surround the light-emitting element is increased; thus, defective shape due to physical impact is hard to occur. Therefore, damages of the lighting device in the manufacture or use of the device can be reduced. Further, since the lighting device of this embodiment has a structure in which element deterioration is not easily caused, a lighting device having long lifetime can be provided. Accordingly, reliability of a lighting device that is one embodiment of the present invention can be improved.

Embodiment 1 can be implemented in appropriate combination with the structures described in the other embodiments.

Embodiment 2

In Embodiment 2, an example of an element structure of a light-emitting element exhibiting organic EL emission which is used in the lighting device of one embodiment of the present invention will be described. The light-emitting element exhibiting the organic EL emission generates less power than LED. Thus, an organic resin can be used as a housing, and therefore reduction in weight can be preferably achieved.

Figure 7A:
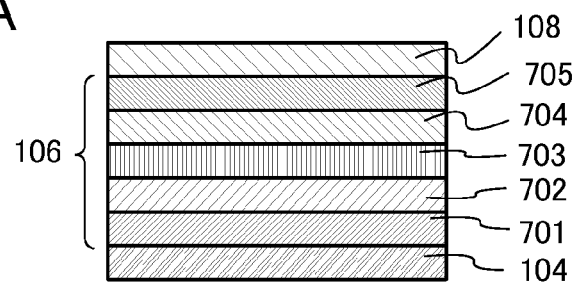
FIGS. 7A and 7C are diagrams each illustrating an example of a light-emitting element which is applicable to a lighting device.

The light-emitting element illustrated in FIG. 7A includes the first electrode 104, the EL layer 106 over the first electrode 104, and the second electrode 108 over the EL layer 106.

The EL layer 106 includes at least a light emitting layer containing a light-emitting organic compound. In addition, the EL layer 106 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like are combined as appropriate. In this embodiment, in the EL layer 106, a hole-injection layer 701, a hole-transport layer 702, a light-emitting layer 703, an electron-transport layer 704, and an electron-injection layer 705 are stacked in this order over the first electrode 104.

A method for manufacturing the light-emitting element illustrated in FIG. 7A will be described.

First, the first electrode 104 is formed. The first electrode 104 is provided in the direction in which light is extracted from the EL layer, and thus is formed using a light-transmitting material.

As the light-transmitting material, indium oxide, an alloy of indium oxide and tin oxide (also referred to as ITO), an alloy of indium oxide and zinc oxide (also referred to as IZO), zinc oxide, zinc oxide to which gallium is added, graphene, or the like can be used.

In addition, for the first electrode 401, a metal material such as gold, platinum, nickel, tungsten, chromium, molybdenum, iron, cobalt, copper, palladium, or titanium can be used. Further, a nitride of the metal material (such as titanium nitride) or the like may be used. In the case of using the metal material (or the nitride thereof), the first electrode 104 may be thinned so as to be able to transmit light.

Next, the EL layer 106 is formed over the first electrode 104. In this embodiment, the EL layer 106 includes a hole-injection layer 701, a hole-transport layer 702, a light-emitting layer 703, an electron-transport layer 704, and an electron-injection layer 705.

The hole-injection layer 701 is a layer containing a substance having a high hole-injection property. Examples of a substance having a high hole-injection property which can be used are metal oxides, such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide. Other examples of a substance that can be used are phthalocyanine-based compounds, such as phthalocyanine (abbreviation: $H_2Pc$) and copper(II) phthalocyanine (abbreviation: CuPc).

Other examples of a substance that can be used are aromatic amine compounds which are low molecular organic compounds, such as 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still other examples of a substance that can be used are high molecular compounds (e.g., oligomers, dendrimers, and polymers), such as poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylaminol}phenyl)methacrylamide](abbreviation: PTPDMA), and poly[N,N'-bis(4-butylphenyl)-N,N'-bis(phenyl)benzidine] (abbreviation: Poly-TPD), and high molecular compounds to which acid is added, such as poly(3,4-ethylenedioxythiophene)/poly(styrenesulfonic acid) (PEDOT/PSS), or polyaniline/poly(styrenesulfonic acid) (PAni/PSS).

In particular, for the hole-injection layer 701, a composite material in which an acceptor substance is mixed with an organic compound having a high hole-transport property is preferably used. Note that by the use of the composite material in which an acceptor substance is added to a substance having a high hole-transport property, hole injection from the first electrode 104 is facilitated, which leads to a reduction in the drive voltage of the light-emitting element. Such a composite material can be formed by co-depositing a substance having a high hole-transport property and an acceptor substance. The hole-injection layer 701 is formed using the composite material, whereby hole injection from the first electrode 104 to the EL layer 106 is facilitated.

As the organic compound for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole-transport property. Specifically, a substance having a hole mobility of $10^{-6}$ $cm^2$Ns or higher is preferably used. Note that other than these substances, any substance that has a property of transporting more holes than electrons may be used. The organic compounds which can be used for the composite material will be specifically shown below.

Examples of the organic compounds that can be used for the composite material include: aromatic amine compounds such as TDATA, MTDATA, DPAB, DNTPD, DPA3B, PCzPCA1, PCzPCA2, PCzPCN1,4,4'-bis[N-(1-naphthyl)-N-phenylamino]biphenyl (abbreviation: NPB or α-NPD), and N,N-bis(3-methylphenyl)-N,N-diphenyl-[1,1'-biphenyl]-4,4'-diamine (abbreviation: TPD) 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl-2,3,5,6-tetraphenylbenzene.

Other examples of an organic compound that can be used are aromatic hydrocarbon compounds, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of an organic compound that can be used are aromatic hydrocarbon compounds, such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9, 9'-bianthryl, anthracene, tetracene, rubrene, perylene, 2,5,8, 11-tetra(tert-butyl)perylene, pentacene, coronene, 4,4'-bis(2, 2-diphenylvinyl)biphenyl (abbreviation: DPVBi), and 9,10-bis[4-(2,2-diphenylvinyl)phenyl]anthracene (abbreviation: DPVPA).

Further, examples of the electron acceptor are organic compounds, such as 7,7,8,8-tetracyano-2,3,5,6-tetrafluoro-quinodimethane (abbreviation: $F_4$-TCNQ) and chloranil, transition metal oxides, and oxides of metals that belong to Groups 4 to 8 in the periodic table. Specific preferred examples include vanadium oxide, niobium oxide, tantalum oxide, chromium oxide, molybdenum oxide, tungsten oxide, manganese oxide, and rhenium oxide because their electron-acceptor properties are high. Among these, molybdenum oxide is especially preferable since it is stable in the air and its hygroscopic property is low and is easily treated.

The composite material may be formed using the above-described electron acceptor and the above-described high molecular compound such as PVK, PVTPA, PTPDMA, or Poly-TPD, and used for the hole-injection layer 701.

The hole-transport layer 702 is a layer that contains a substance having a high hole-transport property. As the substance having a high hole-transport property, any of the following aromatic amine compounds can be used, for example: NPB; TPD; BPAFLP; 4,4'-bis[N-(9,9-dimethylfluoren-2-yl)-N-phenylamino]biphenyl (abbreviation: DFLDPBi); and 4,4'-bis[N-(spiro-9,9'-bifluoren-2-yl)-N-phenylamino]biphenyl (abbreviation: BSPB). The substances mentioned here are mainly substances that have a hole mobility of $10^{-6}$ cm$^2$/Vs or higher. Note that other than the above substances, any substance that has a property of transporting more holes than electrons may be used. Further, the layer including a substance having a high hole-transport property is not limited to a single layer, and may be a stack of two or more layers containing any of the above substances.

For the hole-transport layer 702, a carbazole derivative, such as CBP, CzPA, or PCzPA, or an anthracene derivative, such as t-BuDNA, DNA, or DPAnth, may be used.

For the hole-transport layer 702, a high molecular compound such as PVK, PVTPA, PTPDMA, or Poly-TPD, can be used.

The light-emitting layer 703 is a layer containing a light-emitting organic compound. Examples of the light-emitting organic compound include a fluorescent compound which exhibits fluorescence and a phosphorescent compound which exhibits phosphorescence.

The fluorescent compounds that can be used for the light-emitting layer 703 are given below. Examples of the materials that emit blue light include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(10-phenyl-9-anthryl)-4'-(9-phenyl-9H-carbazol-3-yl)triphenylamine (abbreviation: PCBAPA), and the like. In addition, examples of the materials that emit green light include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9, 10-bis(1,1'-biphenyl-2-yl)-2-anthryl]-N,N',N'-triphenyl-1,4-phenylenediamine (abbreviation: 2DPABPhA), N-[9,10-bis (1,1'-biphenyl-2-yl)]-N-[4-(9H-carbazol-9-yl)phenyl]-N-phenylanthracen-2-amine (abbreviation: 2YGABPhA), N,N, 9-triphenylanthracen-9-amine (abbreviation: DPhAPhA), and the like. Further, examples of the materials that emit yellow light include rubrene, 5,12-bis(1,1'-biphenyl-4-yl)-6, 11-diphenyltetracene (abbreviation: BPT), and the like. Furthermore, examples of the materials that emit red light include N,N,N',N'-tetrakis(4-methylphenyl)tetracene-6,11-diamine (abbreviation: p-mPhTD), 7,14-diphenyl-N,N,N', N'-tetrakis(4-methylphenyl)acenaphtho[1,2-a]fluoranthene-3,10-diamine (abbreviation: p-mPhAFD), and the like.

The phosphorescent compounds that can be used for the light-emitting layer 703 are given below. Examples of the materials that emit blue light include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic), bis{2-[3', 5'-bis(trifluoromethyl)phenyl]pyridinato-N,$C^{2'}$}iridium(III) picolinate (abbreviation: Ir(CF$_3$ppy)$_2$(pic)), bis[2-(4',6'-difluorophenyl)pyridinato-N,$C^{2'}$]iridium(III)acetylacetonate (abbreviation: FIr(acac)), and the like. Examples of the materials that emit green light include tris(2-phenylpyridinato-N, $C^{2'}$)iridium(III) (abbreviation: Ir(ppy)$_3$), bis(2-phenylpyridinato-N,$C^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis (benzo[h]quinolinato)iridium(III)acetylacetonate (abbreviation: Ir(bzq)$_2$(acac)), tris(benzo[h]quinolinato)iridium(III) (abbreviation: Ir(bzq)$_3$), and the like. Examples of the materials that emit yellow light include bis(2,4-diphenyl-1,3-oxazolato-N,$C^{2'}$)iridium(III)acetylacetonate (abbreviation: Ir(dpo)$_2$(acac)), bis[2-(4'-(perfluorophenylphenyl)pyridinato]iridium(III)acetylacetonate (abbreviation: Ir(p-PF-ph)$_2$(acac)), bis(2-phenylbenzothiazolato-N,$C^{2'}$)iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), (acetylacetonato)bis{2-(4-methoxyphenyl)-3,5-dimethylpyrazinato}iridium(III) (abbreviation: Ir(dmmoppr)$_2$(acac)), and the like. Examples of the materials that emit orange light include tris(2-phenylquinolinato-N,$C^{2'}$)iridium(III) (abbreviation: Ir(pq)$_3$), bis(2-phenylquinolinato-N,$C^{2'}$)iridium(III) acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), and the like. Examples of the materials that emit red light include organometallic complexes such as bis[2-(2'-benzo[4,5-α]thienyl)pyridinato-N, $C^{3'}$)iridium(III)acetylacetonate (abbreviation: Ir(btp)$_2$ (acac)), bis(1-phenylisoquinolinato-N,$C^{2'}$)iridium(III) acetylacetonate (abbreviation: Ir(piq)$_2$(acac), (acetylacetonato)bis[2,3-bis(4-fluorophenyl)quinoxalinato] iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$ (dpm)), and (2,3,7,8,12,13,17,18-octaethyl-21H,23H-porphine)platinum(II) (abbreviation: PtOEP). Any of the following rare earth metal complexes can be used as a phosphorescent compound: tris(acetylacetonato)(monophenanthroline)terbium(III) (abbreviation: Tb(acac)$_3$(Phen)); tris(1, 3-diphenyl-1,3-propanedionato)(monophenanthroline) europium(III) (abbreviation: Eu(DBM)$_3$(Phen)); and tris[1-(2-thenoyl)-3,3,3-trifluoroacetonato](monophenanthroline) europium(III) (abbreviation: Eu(TTA)$_3$(Phen)), because their light emission (generated by electronic transition between different multiplicities) is from a rare earth metal ion.

Note that the light-emitting layer 703 may have a structure in which the above-described light-emitting organic compound (a guest material) is dispersed in another substance (a host material). As a host material, various kinds of materials can be used, and it is preferable to use a substance which has a lowest unoccupied molecular orbital level (LUMO level) higher than the light-emitting substance and has a highest occupied molecular orbital level (HOMO level) lower than that of the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), or 6,12-dimethoxy-5,11-diphenylchrysene; an aromatic amine compound such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB; and the like.

Alternatively, as the host material, plural kinds of materials can be used. For example, in order to suppress crystallization, a substance such as rubrene which suppresses crystallization, may be further added. In addition, NPB, Alq, or the like may be further added in order to efficiently transfer energy to the guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, examples of the materials that emit blue light include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Further, examples of the materials that emit green light include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like. Furthermore, examples of the materials that emit orange to red light include poly[2-methoxy-5-(2'-ethylhexoxy)-1,4-phenylenevinylene] (abbreviation: MEH-PPV), poly(3-butylthiophene-2,-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), and the like.

Note that the light-emitting layer 703 may have a stacked-layer structure of two or more layers. When the light-emitting layer 703 has a stacked-layer structure of two or more layers and the kind of light-emitting substance for each light-emitting layer is changed, various emission colors can be obtained. In addition, a plurality of light-emitting substances of different colors is used as the light-emitting substance, whereby light emission having a broad spectrum or white light emission can also be obtained. In particular, for a lighting device in which high luminance is required, a structure in which light-emitting layers are stacked is preferable.

The electron-transport layer 704 is a layer that contains a substance having a high electron-transport property. As the substance having a high electron-transport property, any of the following substances can be used, for example: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here mainly have an electron mobility of $10^{-6}$ cm$^2$/Vs or higher. Furthermore, the electron-transport layer is not limited to a single layer, and two or more layers that contain the above-described substances may be stacked.

The electron-injection layer 70 is a layer that contains a substance having a high electron-injection property. For the electron-injection layer 70, an alkali metal, an alkaline-earth metal, or a compound thereof, such as lithium, cesium, calcium, lithium fluoride, cesium fluoride, calcium fluoride, or lithium oxide, can be used. In addition, a rare earth metal compound such as erbium fluoride can also be used. Any of the substances contained in the electron-transport layer 704 which are given above can also be used.

Note that the hole-injection layer 701, the hole-transport layer 702, the light-emitting layer 703, the electron-transport layer 704, and the electron-injection layer 70 which are described above can each be formed by a method such as an evaporation method (e.g., a vacuum evaporation method), an ink jetmethod, or a coating method.

Figure 7B:
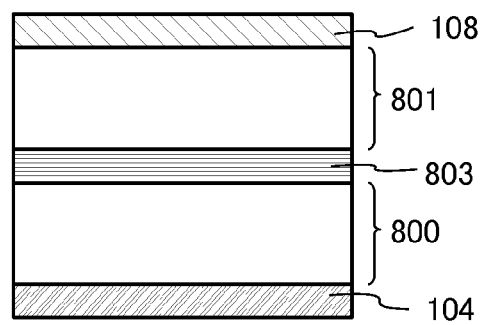

Note that a plurality of EL layers may be stacked between the first electrode 104 and the second electrode 108 as illustrated in FIG. 7B. In that case, a charge generation layer 803 is preferably provided between a first EL layer 800 and a second EL layer 801 which are stacked. The charge generation layer 803 can be formed by using the above-mentioned composite material. Further, the charge generation layer 803 may have a stacked-layer structure including a layer containing the composite material and a layer containing another material. In that case, as the layer that contains another material, a layer that contains an electron-donating substance and a substance having a high electron-transport property, a layer formed of a transparent conductive film, or the like can be used. As for a light-emitting element having such a structure, problems such as energy transfer and quenching hardly occur, and a light-emitting element which has both high emission efficiency and a long lifetime can be easily obtained due to expansion in the choice of materials. Moreover, a light-emitting element which provides phosphorescence from one of the EL layers and fluorescence from the other of the EL layers can be readily obtained. Note that this structure can be combined with the above-described structures of the EL layer.

The charge generation layer 803 between the stacked EL layers, as illustrated in FIG. 7B, makes it possible to achieve light emission with high luminance with current density kept low, and thus a light-emitting element having a long lifetime can be obtained. In addition, the voltage drop due to resistance of the electrode material can be reduced, whereby uniform light emission in a large area is possible.

In the case where the EL layer has a stacked element structure in which two layers are stacked, white light emission can be extracted outside by allowing a first EL layer and a second EL layer to emit light of complementary colors. White light emission can also be obtained with a structure including a plurality of light-emitting layers in which light emission color of the first EL layer and light emission color of the second EL layer are complementary colors to each other. As a complementary relation, blue and yellow, blue green and red, and the like can be given. A substance which emits light of blue, yellow, blue-green, or red light may be selected as appropriate from, for example, the light-emitting substances given above.

The following is an example of a structure where each of the first EL layer and the second EL layer includes a plurality of light-emitting layers emitting light of complementary colors. With this structure, white light emission can be obtained.

For example, the first EL layer includes a first light-emitting layer which has an emission spectrum with a peak in the wavelength range of blue to blue-green, and a second light-emitting layer which has an emission spectrum with a peak in the wavelength range of yellow to orange. The second EL layer includes a third light-emitting layer which has an emission spectrum with a peak in the wavelength range of blue-green to green, and a fourth light-emitting layer which has an emission spectrum with a peak in the wavelength range of orange to red.

In this case, light emission from the first EL layer is a combination of light emission from both the first light-emitting layer and the second light-emitting layer and thus exhibits an emission spectrum having both a peak in the wavelength range of blue to blue-green and a peak in the wavelength range of yellow to orange. That is, the first EL layer emits light of two-wavelength type white or a two-wavelength type color close to white.

In addition, light emission from the second EL layer is a combination of light emission from both the third light-emitting layer and the fourth light-emitting layer and thus exhibits an emission spectrum having both a peak in the wavelength range of blue-green to green and a peal in the wavelength range of orange to red. That is, the second EL layer emits light of two-wavelength type white color or a two-wavelength type color close to white, which is different from that of the first EL layer.

Accordingly, by combining the light emission from the first EL layer and the light emission from the second EL layer, white light emission which covers the wavelength range of blue to blue-green, the wavelength range of blue-green to green, the wavelength range of yellow to orange, and the wavelength range of orange to red can be obtained.

Further, the wavelength range of yellow to orange (greater than or equal to 560 nm and less than 580 nm) is a wavelength range of high luminosity; thus, application of an EL layer which includes a light-emitting layer having an emission spectrum peak in the yellow to orange wavelength range is useful. For example, a structure in which a first EL layer which includes a light-emitting layer having an emission spectrum peak in a blue wavelength range, a second EL layer which includes a light-emitting layer having an emission spectrum peak in a yellow wavelength range, and a third EL layer which includes a light-emitting layer having an emission spectrum peak in a red wavelength range are stacked may be used.

Further, two or more EL layers exhibiting yellow to orange color may be stacked. The power efficiency can be further improved by stacking two or more EL layers exhibiting yellow to orange color.

For example, in the case of a light-emitting element including a three-stacked EL layers, a first EL layer which includes a light-emitting layer having an emission spectrum peak in a blue wavelength range (greater than or equal to 400 nm and less than 480 nm), and a second and a third EL layers each include a light-emitting layer having an emission spectrum peak in yellow to orange wavelength range may be stacked. Note that the wavelengths of the peaks of the spectra of light emitted from the second EL layer and the third EL layer may be the same or different from each other.

The use of the EL layer which has an emission spectrum peak in the yellow to orange wavelength range makes it possible to utilize the wavelength range of high luminosity and to improve power efficiency. Accordingly, the power efficiency of the whole light-emitting element can be improved. Such a structure is advantageous in terms of luminosity and power efficiency can be improved in comparison with the case where, for example, an EL layer emitting green light and an EL layer emitting red light are stacked to obtain a light-emitting layer emitting yellow to orange light. Further, the emission intensity of light of the blue wavelength range of low luminosity is relatively low in comparison with the case of using one EL layer which has an emission spectrum peak in the yellow to orange wavelength range of high luminosity; thus, the color of emitted light is close to light bulb color (or warm white), and the power efficiency is improved.

In other words, in the above light-emitting element, the color of light which is obtained by combining light whose emission spectrum peak is in the yellow to orange wavelength range and whose wavelength of the peak is greater than or equal to 560 nm and less than 580 nm and light whose emission spectrum peak is in the blue wavelength range (i.e., the color of light emitted from the light-emitting element) can be natural color like warm white or light bulb color. In particular, light bulb color can be easily achieved.

For example, an organometallic complex in which a pyrazine derivative functions as a ligand can be used as the light-emitting substance which emits light having a peak in the yellow to orange wavelength range. Alternatively, the light-emitting layer can be formed by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex in which a pyrazine derivative functions as a ligand is a phosphorescent compound, has high emission efficiency, and easily emits light in the yellow to orange wavelength range, and thus is favorable.

For example, a pyrene diamine derivative can be used as the light-emitting substance which emits light having a peak in the blue wavelength range. A fluorescent compound can be used as the light-emitting substance which emits light having a peak in the blue wavelength range. The use of a fluorescent compound makes it possible to obtain a light-emitting element which has a longer lifetime than a light-emitting element in which a phosphorescent compound is used. The above pyrene diamine derivative is a fluorescent compound, can obtain an extremely high quantum yield, and has a long lifetime; thus, the above pyrene diamine derivative is favorable.

Figure 7C:
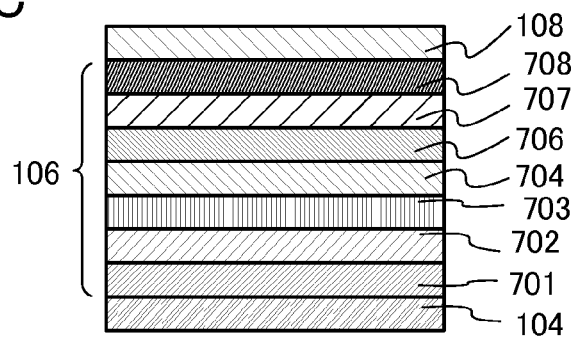

As illustrated in FIG. 7C, the EL layer may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 108, between the first electrode 104 and the second electrode 108.

It is preferable to provide the composite material layer 708 which is in contact with the second electrode 108, in which case damage caused to the EL layer 106 particularly when the second electrode 108 is formed by a sputtering method can be reduced. The composite material layer 708 can be formed using the above-described composite material in which an acceptor substance is mixed with an organic compound having a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

A substance having a high electron-injection property can be used for the electron-injection buffer layer 706: for example, an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate).

Further, in the case where the electron-injection buffer layer 706 contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide of lithium oxide or the like, a halide, and carbonate such as lithium carbonate or cesium carbonate), an alkaline earth metal compound (including oxide, a halide, and carbonate), and a rare earth metal compound (including oxide, a halide, and carbonate). Note that as the substance having a high electron-injection property, a material similar to the material for the electron-transport layer 704 described above can be used.

Furthermore, the electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Accordingly, an increase in the driving voltage can be prevented.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably greater than or equal to −5.0 eV, more preferably greater than or equal to −5.0 eV and less than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, in particular, any of the followings is preferably used: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex having a metal-oxygen bond and an aromatic ligand, which is contained in the electron-relay layer 707, a metal complex having a metal-oxygen double bond is preferably used. The metal-oxygen double bond has acceptor properties (properties of easily accepting electrons); thus, electrons can be transferred (donated and accepted) more easily. Further, the metal complex which has a metal-oxygen double bond is considered stable. Thus, the use of the metal complex having the metal-oxygen double bond enables the light-emitting element to drive at low voltage more stably.

As a metal complex having a metal-oxygen bond and an aromatic ligand, a phthalocyanine-based material is preferable. Specifically, any of vanadyl phthalocyanine (VOPc), a phthalocyanine tin (IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based materials described above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent; thus, the phthalocyanine derivative has an advantage of being easily handled during formation of a light-emitting element and an advantage of facilitating maintenance of an apparatus used for deposition.

The electron-relay layer 707 may further contain a donor substance. Examples of the donor substance include an organic compound such as tetrathianaphthacene (abbreviation: TTN), nickelocene, and decamethylnickelocene, in addition to an alkali metal, an alkaline earth metal, a rare earth metal, and a compound of the above metals (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, in addition to the materials described above as the substance having a high electron-transport property, a substance having a LUMO level greater than the acceptor level of the acceptor substance contained in the composite material layer 708 can be used. As a specific energy level, a LUMO level is greater than or equal to −5.0 eV, preferably greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron-relay layer 707 because of its stability.

As specific examples of the perylene derivative, the following can be given: 3,4,9,10-perylenetetracarboxylicdianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (Hex PTC), and the like.

As specific examples of the nitrogen-containing condensed aromatic compound, the following can be given: pirazino[2,3-f][1,10]phenanthroline-2,3-dicarbonitrile (PPDN), 2,3,6,7,10,11-hexacyano-1,4,5,8,9,12-hexaazatriphenylene (HAT (CN)$_6$), 2,3-diphenylpyrido[2,3-b]pyrazine (2PYPR), 2,3-bis (4-fluorophenyl)pyrido[2,3-b]pyrazine (F2PYPR), and the like.

Besides, 7,7,8,8-tetracyanoquinodimethane (abbreviation: TCNQ), 1,4,5,8-naphthalenetetracarboxylicdianhydride (abbreviation: NTCDA), perfluoropentacene, copper hexadecafluoro phthalocyanine (abbreviation: $F_{16}$CuPc), N,N'-bis(2,2,3,3,4,4,5,5,6,6,7,7,8,8,8-pentadecafluorooctyl)-1,4,5,8-naphthalenetetracar boxylic diimide (abbreviation: NTCDI-C8F), 3',4'-dibutyl-5,5''-bis(dicyanomethylene)-5,5''-dihydro-2,2':5',2''-terthiophen (abbreviation: DCMT), a methanofullerene (e.g., [6,6]-phenyl $C_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may be each formed using any of the above-described materials.

Then, the second electrode 108 is formed over the EL layer 106.

The second electrode 108 is provided on the side opposite to the side from which light is extracted and is formed using a reflective material. As the reflective material, a metal material such as aluminum, gold, platinum, silver, nickel, tungsten, chromium, molybdenum, iron, cobalt, copper, or palladium can be used. Besides, an alloy containing aluminum (an aluminum alloy) such as an alloy of aluminum and titanium, an alloy of aluminum and nickel, or an alloy of aluminum and neodymium, or an alloy containing silver such as an alloy of silver and copper can be used. The alloy of silver and copper is preferable because it has high heat resistance. Further, by stacking a metal film or a metal oxide film in contact with the aluminum alloy film, oxidation of the aluminum alloy film can be suppressed. Examples of a material for the metal film and the metal oxide film include titanium, titanium oxide, and the like. The above materials are preferable because they are present in large amounts in the earth's crust and inexpensive to achieve a reduction in the cost of manufacturing a light-emitting element.

Note that this embodiment can be freely combined with any of the other embodiments.

Embodiment 3

In this embodiment, application examples of the lighting device will be described.

Figure 8:
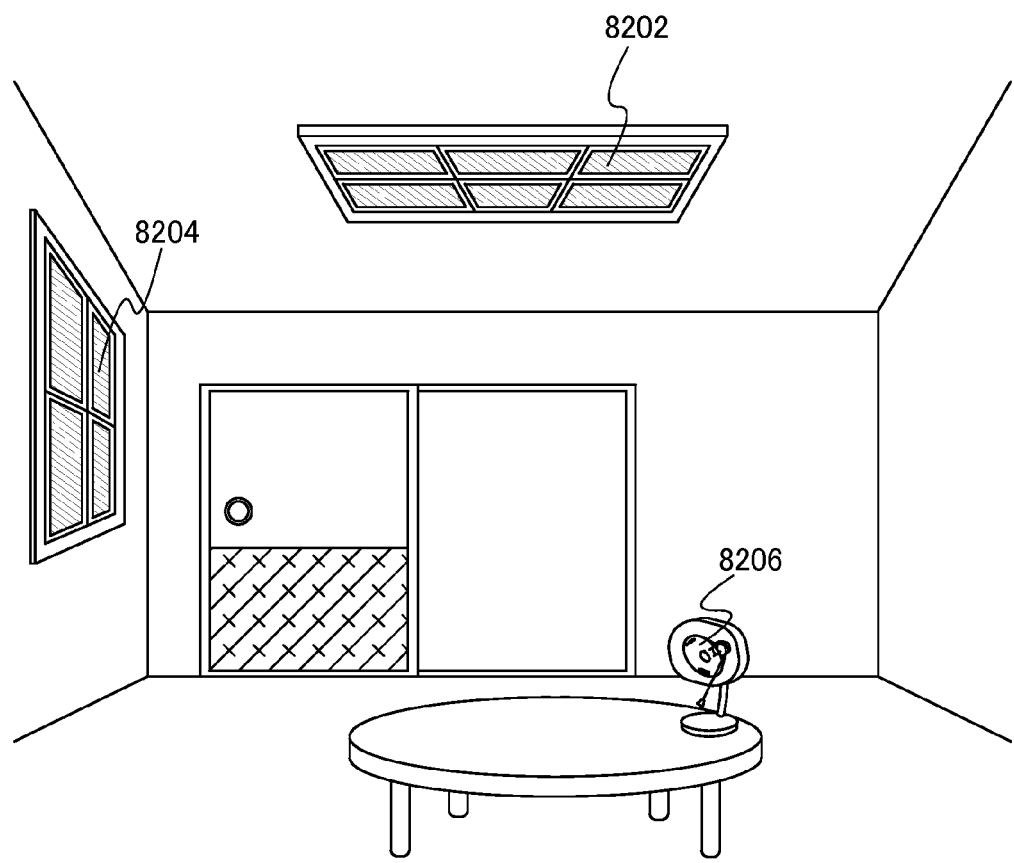
FIG. 8 is a diagram illustrating an example of application of a lighting device.

FIG. 8 illustrates an example in which the lighting device of one embodiment of the present invention is used as an indoor lighting device. The lighting device of one embodiment of the present invention can be used not only as a ceiling-mounted lighting device 8202, but also as a wall-mounted lighting device 8204. The lighting device can also be used as a desk lighting device 8206. Since the lighting device of one embodiment of the present invention has a planar light source, it has advantages such as a reduction in the number of components like a light-reflecting plate as compared with the case of using a point light source, or less heat generation as compared with a filament bulb, and is preferably used as an indoor lighting device.

Next, FIGS. 9A to 9D illustrate examples in which the lighting device of one embodiment of the present invention is applied to a lighting device such as traffic lights or guide lights.

Figure 9A:
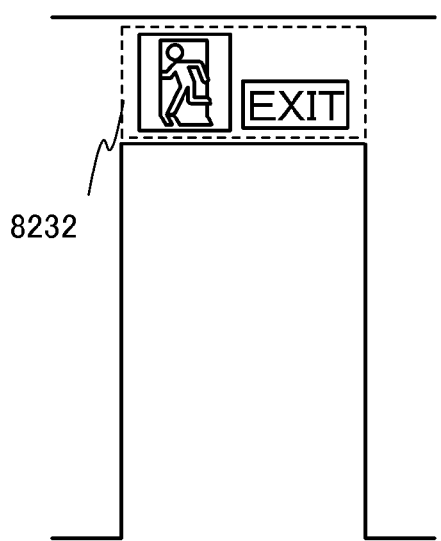
FIGS. 9A to 9D are diagrams each illustrating an example of application of a lighting device.

FIG. 9A illustrates an example in which the lighting device of one embodiment of the present invention is applied to an emergency exit light.

For example, FIG. 9A is an external view of an emergency exit light. An emergency exit light 8232 can be formed by combination of a lighting device and a fluorescent plate provided with a fluorescent portion. The emergency exit light 8232 can also be formed by combination of a lighting device emitting a specific light and a light-shielding plate provided with a transmitting portion having a shape illustrated in the drawing. The lighting device that is one embodiment of the present invention can emit light with a constant luminance, and thus is preferably used as an emergency exit light that needs to be on at all times.

Figure 9B:
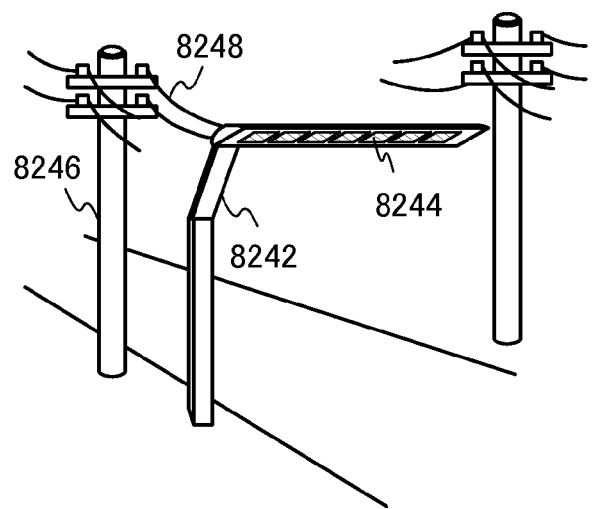

FIG. 9B illustrates an example in which the lighting device of one embodiment of the present invention is applied to an outdoor light.

An example of the outdoor light is a streetlight. A streetlight can be formed by, for example, a housing 8242 and a lighting portion 8244 as illustrated in FIG. 9B. A plurality of lighting devices of one embodiment of the present invention can be arranged in the lighting portion 8244. As illustrated in FIG. 9B, for example, the streetlight stands by the side of a road so that the lighting portion 8244 can illuminate the surroundings, whereby the visibility of the road and its surroundings can be improved.

In the case where a power source voltage is supplied to the streetlight, for example, it can be supplied through a power line 8248 on a utility pole 8246 as illustrated in FIG. 9B. Note that the present invention is not limited to this case; for example, a photoelectric converter may be provided in the housing 8242 so that a voltage obtained from the photoelectric converter can be used as a power source voltage.

Figure 9C:
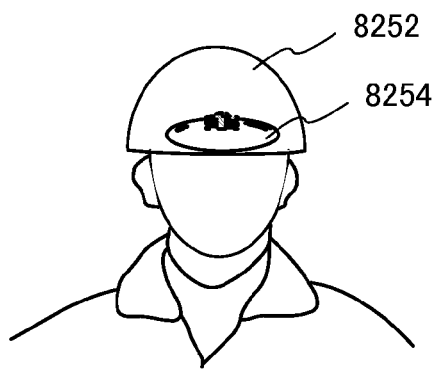
Figure 9D:
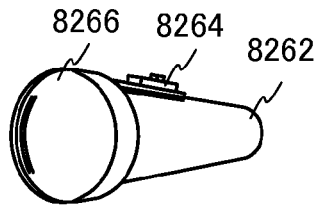

FIGS. 9C and 9D illustrate examples in which the lighting device of one embodiment of the present invention is applied to a portable light. FIG. 9C illustrates a structure of a wearable light and FIG. 9D illustrates a structure of a handheld light.

The wearable light illustrated in FIG. 9C includes a mounting portion 8252 and a lighting portion 8254 fixed to the mounting portion 8252. The lighting device that is one embodiment of the present invention can be used for the lighting portion 8254. In the wearable light illustrated in FIG. 9C, the lighting portion 8254 can emit light while the mounting portion 8252 is attached to the head. When a planar light source is used for the lighting portion 8254, the visibility of the surroundings can be improved. In addition, the lighting portion 8254 is lightweight, which makes it possible to reduce the load on the head on which the light is mounted.

Note that the structure of the wearable light is not limited to that illustrated in FIG. 9C. For example, the mounting portion 8252 may be a belt of flat string or rubber band, the lighting portion 8254 may be fixed to the belt, and the belt may be directly tied around the head.

The handheld light illustrated in FIG. 9D includes a housing 8262, a lighting portion 8266, and a switch 8264. The lighting device that is one embodiment of the present invention can be used for the lighting portion 8266. The use of the lighting device that is one embodiment of the present invention reduces the thickness of the lighting portion 8266 and thus reduces the size of the light, which makes it easy for the light to be carried around.

The switch 8264 has a function of controlling emission or non-emission of the lighting portion 8266. The switch 8264 can also have a function of controlling, for example, the luminance of the lighting portion 8266 during light emission.

In the handheld light illustrated in FIG. 9D, the lighting portion 8266 is turned on with the switch 8264 so as to illuminate the surroundings, whereby the visibility of the surroundings can be improved. Furthermore, since the lighting device that is one embodiment of the present invention has a planar light source, the number of components like a light-reflecting plate can be reduced as compared with the case of using a point light source.

What is described in this embodiment with reference to each drawing can be freely combined with or replaced with what is described in other embodiments as appropriate.

This application is based on Japanese Patent Application serial no. 2010-23112 filed with Japan Patent Office on Oct. 20, 2010, the entire contents of which are hereby incorporated by reference.

What is claimed is:

1. A lighting device comprising:
   a first housing comprising a first depressed portion and a second depressed portion;
   a light-emitting element over the first housing;
   a metal plate over the light-emitting element;
   a second housing over the metal plate;
   a first adhesive layer in and over the first depressed portion, and between the first housing and the metal plate; and
   a second adhesive layer in and over the second depressed portion, and between the first housing and the second housing,
   wherein the first depressed portion and the second depressed portion are spaced from each other.

2. A lighting device comprising:
   a first housing;
   a light-emitting element over the first housing, and comprising a first electrode, a second electrode and an EL layer between the first electrode and the second electrode;
   a metal plate over the light-emitting element, and attached to the first housing with a first adhesive layer;
   a second housing over the metal plate, and attached to the first housing with a second adhesive layer; and
   an auxiliary wiring between the first housing and the light-emitting element,
   wherein the light-emitting element is sealed with the first housing, the metal plate and the first adhesive layer,
   wherein the light-emitting element and the metal plate are sealed with the first housing, the second housing and the second adhesive layer,
   wherein the first housing covers a light emission surface of the light-emitting element,
   wherein the first housing has a first uneven shape and a second uneven shape on a side opposite to the first uneven shape,
   wherein the first housing comprises a first depressed portion with the first adhesive layer therein, a second depressed portion with the second adhesive layer therein, a third depressed portion, and a fourth depressed portion,
   wherein at least one of the first electrode and the second electrode has a light-transmitting property,
   wherein the auxiliary wiring comprises a first portion in the third depressed portion and a second portion in the fourth depressed portion, and
   wherein thickness and width of the first portion and that of the second portion are different from each other.

3. The lighting device according to claim 2, further comprising an inorganic insulating film between the first housing and the auxiliary wiring.

4. The lighting device according to claim 1, wherein the light-emitting element comprises a first electrode, a second electrode, and an EL layer therebetween.

5. The lighting device according to claim 2, wherein a thickness of the metal plate is greater than or equal to 10 μm and less than or equal to 200 μm.

6. The lighting device according to claim 4, wherein the EL layer comprises two or more layers with an intermediate layer interposed therebetween.

7. The lighting device according to claim 2, wherein the EL layer comprises two or more layers with an intermediate layer interposed therebetween.

8. The lighting device according to claim 2,
   wherein the first portion is over a bottom surface of the third depressed portion, and
   wherein the second portion is over a bottom surface of the fourth depressed portion.

9. The lighting device according to claim 1, wherein the first housing is formed using an organic resin.

10. The lighting device according to claim 2, wherein the first housing is formed using an organic resin.

11. The lighting device according to claim 1, wherein the light-emitting element is sealed with the first housing, the metal plate, and the first adhesive layer.

12. The lighting device according to claim 3, wherein the inorganic insulating film is a single layer or a stacked layer comprising a silicon oxide, a silicon nitride, a silicon oxynitride, an aluminum oxide, an aluminum nitride, and/or an aluminum oxynitride.

13. The lighting device according to claim 1, wherein the light-emitting element and the metal plate are sealed with the first housing, the second housing, and the second adhesive layer.

14. The lighting device according to claim 2, wherein height of the second uneven shape is smaller than that of the first uneven shape.

15. The lighting device according to claim 1, further comprising:
   a third depressed portion and a fourth depressed portion in the first housing; and
   a wiring between the first housing and the light-emitting element,
   wherein the wiring comprises a first portion in the third depressed portion and a second portion in the fourth depressed portion, and
   wherein thickness and width of the first portion and that of the second portion are different from each other.

16. The lighting device according to claim 2, further comprising a high refractive index material layer between the light-emitting element and the second uneven shape, the high refractive index material layer being in contact with the second uneven shape.

* * * * *